United States Patent [19]

Kaneko

[11] Patent Number: 4,661,959
[45] Date of Patent: Apr. 28, 1987

[54] LASING DEVICE

[75] Inventor: Yutaka Kaneko, Yokohama, Japan

[73] Assignee: Ricoh Company, Ltd., Tokyo, Japan

[21] Appl. No.: 701,514

[22] Filed: Feb. 14, 1985

[30] Foreign Application Priority Data

Feb. 17, 1984 [JP] Japan .................. 59-28063
Feb. 17, 1984 [JP] Japan .................. 59-28064

[51] Int. Cl.$^4$ .............................................. H01S 3/04
[52] U.S. Cl. ...................................... 372/34; 372/103; 372/107; 372/108; 372/24
[58] Field of Search ................... 372/34, 36, 43, 24, 372/107, 108, 101, 65, 103

[56] References Cited

U.S. PATENT DOCUMENTS 4,338,577 7/1982 Sato et al. ............................. 372/36
4,567,598 1/1956 Noguchi et al. ..................... 372/36

Primary Examiner—Leon Scott, Jr.
Attorney, Agent, or Firm—Oblon, Fisher, Spivak, McClelland & Maier

[57] ABSTRACT

A lasing device includes heat-insulating members for individually surrounding support members associated with a semiconductor laser and a collimating lens assembly. Temperature control means is provided for controlling the support members to a predetermined temperature.

6 Claims, 6 Drawing Figures

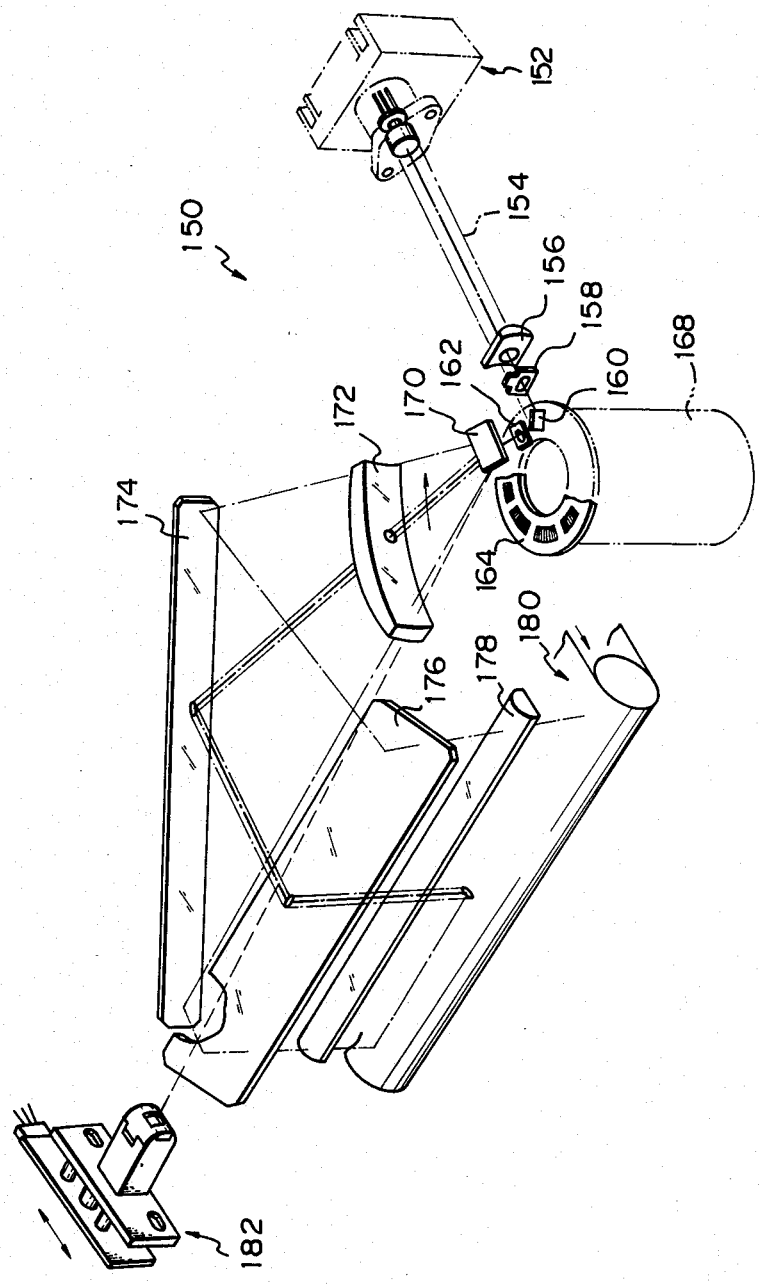

LASING DEVICE

BACKGROUND OF THE INVENTION

The present invention relates to a lasing device for generating a laser beam and, more particularly, to a lasing device applicable to a laser printer.

Lasers known in the art include a semiconductor laser. Compared to other lasers such as a gas laser, a semiconductor laser is small size and inexpensive, saves power, and allows its lasing intensity modulated linearly by means of drive current. By virtue of such advantages, the semiconductor laser is suitable for use with an optical scanning device as a light source.

An example of optical scanning devices of the type employing a semiconductor laser is shown in FIG. 1. In FIG. 1, a lasing device, generally 10, comprises a semiconductor laser 12 which is supported by a mount 14 and constantly controlled to an adequate temperature which ensures performance by means of a thermistor 16 and Peltie effect element 18, which serves as a temperature control element. These elements are surrounded by a heat-insulating member 20 to be thermally isolated from the outside. Located in front of the semiconductor laser 12 is a lens unit 22 in which a collimating lens is installed to convert divergent light issuing from the laser 12 to parallel light. While a larger numerical aperture (NA) provides a greater coupling efficiency of a coupled lens, an increase in the numerical aperture is accompanied by a decrease in the depth of a focus and, therefore, requires accurate positioning of the lens. Generally, a numerical aperture of about 0.3 is considered acceptable in in view of its relation with the focal depth.

In the prior art device 10, although the semiconductor laser 12 is surrounded by the heat-insulating member 20 and controlled in temperature, support members 24 and 26 supporting the lens unit 22 are placed in an environment which is no more than atmospheric one with respect to heat and, in addition, their temperature is not controlled and, so, directly effected by the ambient temperature.

As a result of temperature variations due to the drive of the lasing device 10 and the optical scanning device using it as well as variations of room temperature, the support members 24 and 26 undergo thermal expansion (or contraction) which in turn causes a change in the spacing between the semiconductor laser 12 and the collimating lens. Such prevents a desired imaging beam diameter from being provided on a photoconductive element or a document.

SUMMARY OF THE INVENTION

It is therefore an object of the present invention to provide a lasing device which is capable of maintaining a semiconductor laser and a collimating lens physically spaced a predetermined distance.

It is another object of the present invention to provide a generally improved lasing device.

A lasing device for use with an optical scanning system of the present invention comprises a semiconductor laser for emitting a divergent laser beam, an optical system for converting the laser beam issuing from the semiconductor laser to a parallel beam, support members for mechanically supporting the semiconductor laser and the optical arrangement in a predetermined imaging position, and temperature control elements for controlling a temperature of the support members to a predetermined temperature.

In accordance with the present invention, a lasing device includes heat-insulating members for individually surrounding support members associated with a semiconductor laser and a collimating lens assembly. Temperature control means is provided for controlling the support members to a predetermined temperature.

The above and other objects, features and advantages of the present invention will become more apparent from the following detailed description taken with the accompanying drawings.

BRIEF DESCRIPTION OF THE DRAWINGS

FIG. 5 is a perspective view of an essential part of an optical scanning device to which the lasing device of the present invention is applicable.

DESCRIPTION OF THE PREFERRED EMBODIMENT

While the lasing device of the present invention is susceptible of numerous physical embodiments, depending upon the environment and requirements of use, a substantial number of the herein shown and described embodiment have been made, tested and used, and all have performed in an eminently satisfactory manner.

One approach to solve the problem of the prior art lasing device is thermally isolating support members associated with a semiconductor laser and a collimating lens from the ambience by a heat-insulating member and, at the same time, controlling the temperature inside the heat-insulating member to free the support members from temperature variations due to heat radiating from the laser itself. In case the laser and collimating lens are enclosed in the heat-insulating member together with the individual support members, at least the optical path for a laser beam needs be provided using an optically apertured and, yet, thermally insulating member.

Meanwhile, an optical scanning system now under development is of the type which uses a hologram grating disc for deflecting a laser beam issuing from a semiconductor laser. The deflected laser beam is caused to converge in a spot on a plane to be scanned, thereby linearly scanning the plane in a main-scan direction. It has been found that in the aspect of laser beam utilization efficiency a ½ wavelength plate should preferably be disposed in an optical path which extends from the semiconductor laser to the hologram grating disc. In accordance with the present invention, paying attention to the fact that quartz used as the ½ wavelength plate is heat-insulating, the ½ wavelength plate is employed to thermally shut off the aperture which is provided in a part of the heat-insulating member to define an optical path, the heat-insulating member surrounding the laser and collimating lens as well as their support members.

Figure 1:
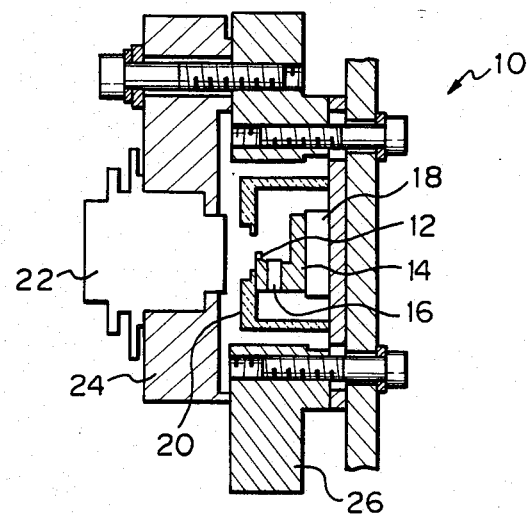
FIG. 1 is a section of a prior art lasing device.
Figure 2:
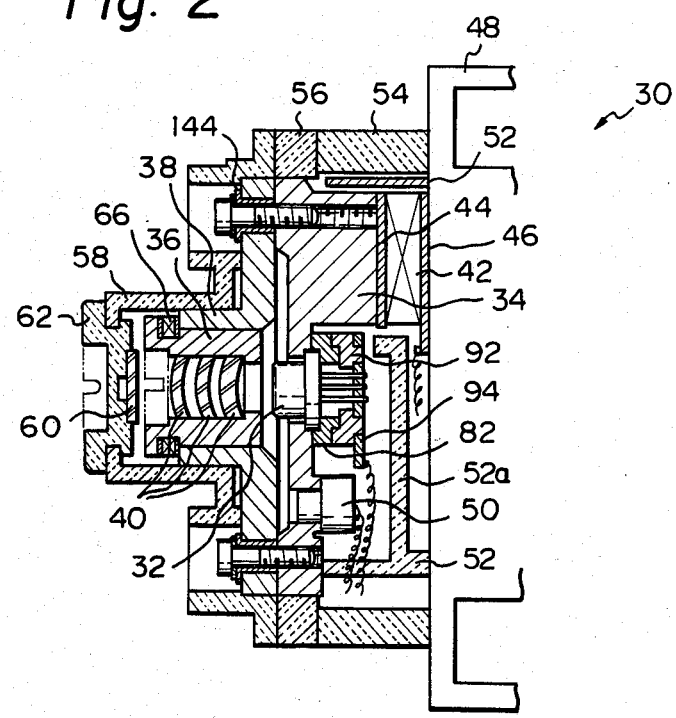
FIG. 2 is a section of a lasing device embodying the present invention.

Referring to FIG. 2, a lasing device embodying the present invention is shown and generally designated by the reference numeral 30. The device 30 includes a semiconductor laser 32, a spacer 34 supporting the laser 32, a lens unit holder 36, and a flange 38 supporting the lens unit holder 36 and mounted on the spacer 34 in tight engagement therewith. Collimating lenses 40 are mounted in the lens unit holder 36. A silicon rubber sheet 44 is tightly applied to the surface of the spacer 34 opposite to the flange 38. A Peltier element 42 is sandwitched between the silicon rubber sheet 44 and another silicon rubber sheet 46. Tightly applied to the silicon rubber sheet 46 is a finned member 48 for heat radiation.

In the above construction, the spacer 34 and the flange 38 are each made of a thermally highly conductive material such as aluminum alloy. A thermistor 50 is mounted on the spacer 34 at a spacing from the Berche effect element 42. A second spacer 52 made of a heat-insulating material has a wall 52a which intervenes between the semiconductor laser 32 and the finned member 48 to thermally isolate the laser 32. the spacer 52 covers a part of the spacer 34. The silicon rubber sheets 44 and 46, which are thermally conductive and electrically insulative, serve to hold the Peltie effect element 42 in tight contact with the spacer 34 and finned member 48 and, thereby, set up good thermal conduction.

The spacer 34 and semiconductor laser 32 are controlled to a predetermined temperature in response to temperature sensed by the thermistor 50. This temperature control effect extends to the flange 38 which supports the lens unit holder 36, whereby the flange 38 is also controlled to the same temperature. That is, the temperature controlling performance of the Peltie effect element 42 extends even to the support member associated with the collimating lenses 40 and, hence, thermal expansion (contraction) of the support member is eliminated which would affect the spacing between a laser and collimating lenses as in the prior art device.

Another characteristic feature of the illustrative embodiment resides in that the spacer 34, flange 38 and other support members are also surrounded by a heat-insulating member in order to further enhance the function of the Peltie effect element 42 and to attain an improvement in drive energy efficiency. Such will be described in detail hereinafter.

The spacer 34 is surrounded by a cylindrical first heat-insulating member 54 and a second heat-insulating member which is tightly engaged with the first member 54, while the flange 38 is surrounded by a second flange 58 which is made of synthetic resin or like heat-insulating material. The second flange 58 is mounted as if it provided the second heat-insulating member 56 with a cap. The second flange 58 has to be provided with an aperture for defining an optical path for a laser beam, and a ½ wavelength plate 60 is used to thermally shut off the aperture. As will be described, where a holoscanner is used as scanning means, the ½ wavelength plate 60 functions to rotate the deflection plane of the laser beam 90 degrees to match it to the grating direction of hologram, thereby enhancing the diffraction efficiency available with hologram. The plate 60 is fixed by adhesion to a holder 62 which in turn is mounted on the second flange 58.

As described above, the spacer 34, flange 38, semiconductor laser 32 and the like are surrounded by heat-insulating members and, therefore, little susceptibe to variations of ambient temperature. This reduces the load on the Peltie effect element 42 to thereby enhance the performance in maintaining the temperature constant.

Figure 3:
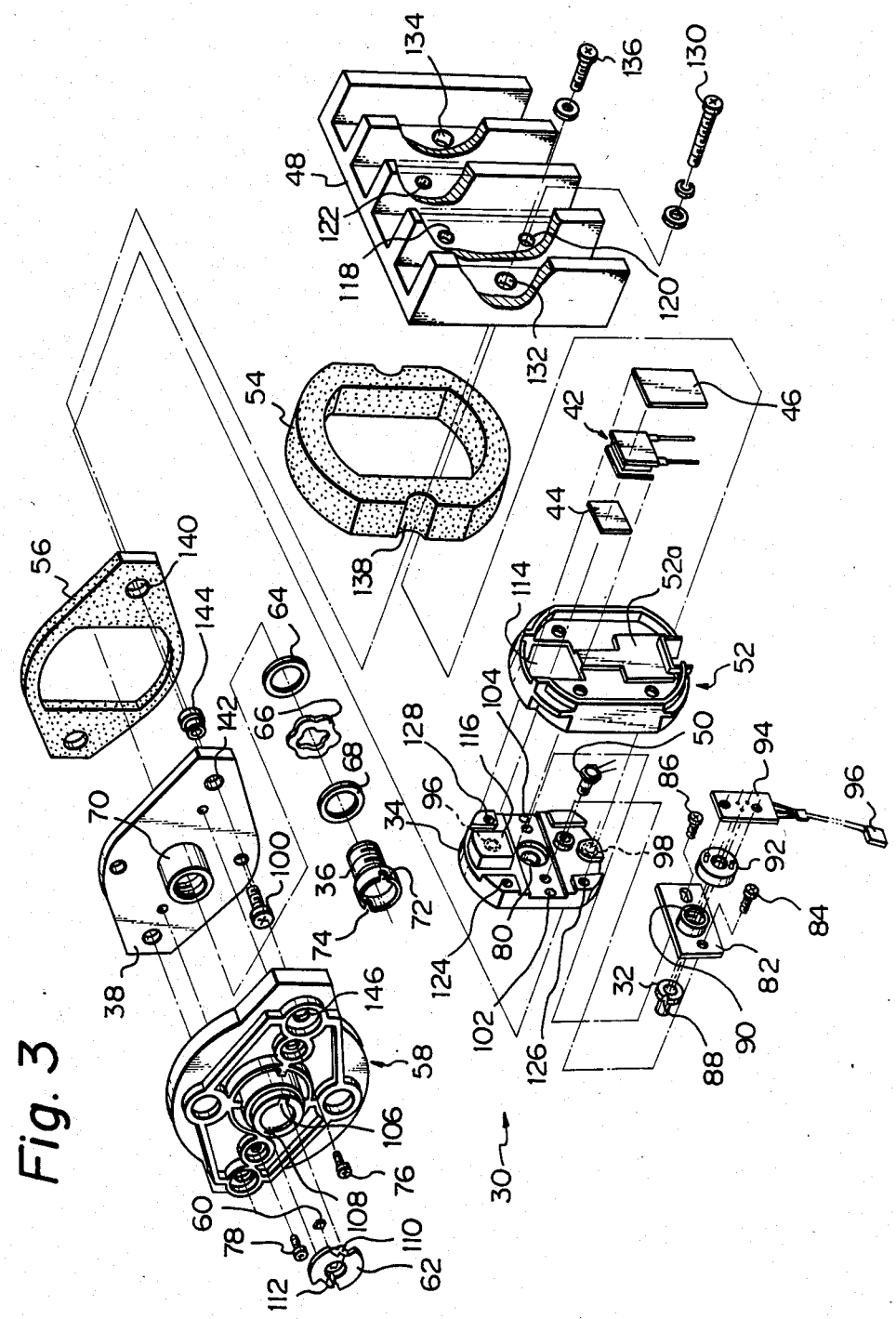
FIG. 3 is an exploded perspective view of the device shown in FIG. 2.

The device described above with reference to FIG. 2 is shown in a more specific construction in FIG. 3. The construction of FIG. 3 will be described following an assembling sequence thereof.

In FIG. 3, the lens unit holder 36 is screwed into a tubular portion 70 of the flange 38 through a washer 64, a corrugated washer 66 and a washer 68. The lens unit holder 36 is provided with notches 72 and 74 with which a wrench is engageable to screw the holder 36 into the tubular portion 70 and, also, to adjust the focus. The flange 38 now carrying the lens unit holder 36 therewith is fastened to the second flange 58 by means of screws 76 and 78.

Subsequently, the semiconductor laser 32 is input in a hole 80 of the spacer 34 to abut against a stepped seat in the hole 80 and, then, a retainer plate 82 is fastened to the spacer 34 by screws 84 and 86, so that the laser 32 is pressed by the retainer plate 82 from behind. In this instance, a notch 88 of the laser 32 is mated with a pin-like member which projects radially inwardly from the wall of a hole 90, which is formed through the retainer plate 82 to receive the laser 32, thereby specifying the orientation of the junction of the laser 32. A spacer 92 designed with electrical insulation taken into consideration is coupled over a tubular projection which extends from the hole 90 of the retainer plate 82. A printed circuit board 94 for driving the laser 32 is mounted to the spacer 92 from behind. A terminal 96 is electrically connected to the printed circuit board 94. The thermistor 50 is also screwed into spacer 34.

The spacer 34 with the laser 32 and the like mounted thereon is fixed to the flange 38 by means of screws, one of which is shown and labeled 100, which are screwed into threaded hole 96 and 98 of the spacer 34 through holes of the flange 38. Also performed at this stage of assembly is the alignment of the emitting point of the laser 32 to the optical axis of the collimating lenses 40 which is accomplished by engaging a tool in holes 102 and 104 of the spacer 34. Specifically, the alignment is performed by pressing the spacer 34 against the flange 38 and, then, moving the spacer 34 a little within the same plane. Thereafter, a wrench is inserted into an opening of the second flange 58 into engagement with the notches 72 and 74 of the lens unit holder 36, so as to rotate the lens unit holder 36 to make output light parallel.

Then, the holder 62 is attached to the second flange 58 by inserting pawls 110 and 112 of the holder 62 into notches 106 and 108, which are contiguous with an opening of the flange 58, and then rotating the holder 62. Let it be assumed that the ½ wavelength plate 60 made of quartz or like heat insulating mterial has already been fit on the holder 62.

The next step is pressing the second heat-insulating member 56 and the first heat-insulating member 54, which is laid on the second member 56, against the flange 38 and pressing the second spacer 52 against the spacer 34. In this condition, the silicon rubber sheet 44. Peltie effect element 42 and silicon rubber sheet 46 are applied in this order to a seat 166 provided on the spacer 34 through an opening 114 of the second spacer 52. Then, three screws, one of which is shown and labeled 130, are sequentially inserted into three holes 118, 120 and 122 of the fin 48, an opening of the first heat-insulating member 54, and three holes of the second spacer 52 to be driven into three threaded holes 124, 126 and 128 of the spacer 34.

The unitary laser beam emitter assembly 30 provided by the above procedure is mounted to a desired optical scanner body using two holes 132 and 134 formed through the finned member 48. One of screws to be passed through the holes 132 and 134 is designated by the reference numeral 136. The screw 136, for example, will be driven into a side panel of the scanner body (not shown) by way of the opening 132, a notch 138 provided on a side of the first heat-insulating member 54, an opening 140 of the second heat-insulating member 56, a bushing 144 made of heat-insulating synthetic resin and nested in a hole 142 of the flange 38, and a hole 146 of the second flange 58.

For clarity, the members made of heat-insulating materials described so far will be listed: second flange 58 made of synthetic resin, bushing 144 also made of synthetic resin, first and second heat-insulating members made of foamed urethane, second spacer 52 made of synthetic resin, $\frac{1}{2}$ wavelength plate 60 made of quartz, and holder 62 made of synthetic resin.

Figure 4:
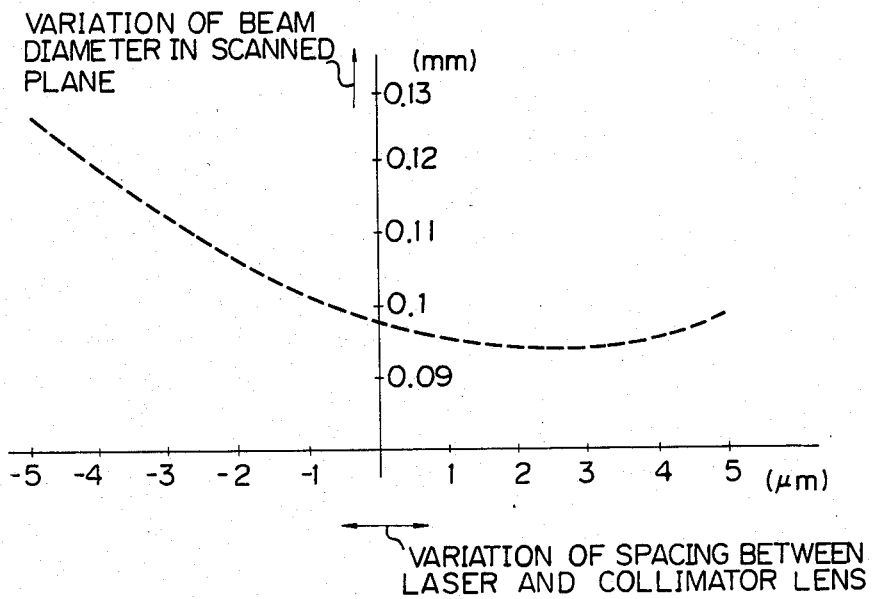
FIG. 4 is a graph showing changes of a beam diameter in a plane to be scanned which result from displacements of a semiconductor laser.

Referring to FIG. 4, there is shown a relationship between changes in the spacing between collimating lens assembly and a secimiconductor laser and those in the beam diameter on a scanned plane. Such a relation was confirmed with a scanning device which comprised a collimating lens assembly having a focal distance of 9 millimeters, an fθ lens having a focal distance of 300 millimeters, a necessary optical system, and a scanner.

Assuming that the support members are made of aluminum (having a linear expansion coefficient of $23.6 \times 10^{-6}$ cm/cm deg), that the maximum presumable temperature variation is 35 degrees, and that no temperature control means is used, then the displacement of the semiconductor laser relative to the collimating lenses is as large as 8 microns so that the beam diameter on the scanned plane changes beyond an range which is allowable in forming images. By practicing the present invention, in contrast, the temperature variation can be confined to a range of $\pm 1°$ C. which is reflected by a relative displacement of the semicondutor laser of not more than about 0.47 microns, but such is negligible in the image forming aspect.

The significance of installing a $\frac{1}{2}$ wavelength plate in the optical path between a semiconductor laser and a hologram grating disc will become more apprent from the following supplementary explanation.

Due to limitations originating from the inherent construction of an optical scanning device, a laser beam from a semiconductor laser which is incident to a hologram diffraction grating at an angle of 90 degrees relative to the grating lines of the diffraction grating. The $\frac{1}{2}$ wavelength plate, in short, functions to rotate the electric field oscillation plane of the laser beam 90 degrees so that the maximum utilization efficiency may be attaind in scanning a given plane by the laser beam.

In this connection, an embodiment of an optical scanning device which employs a semiconductor laser and a hologram grating disc in combination will be described.

Figure 6:
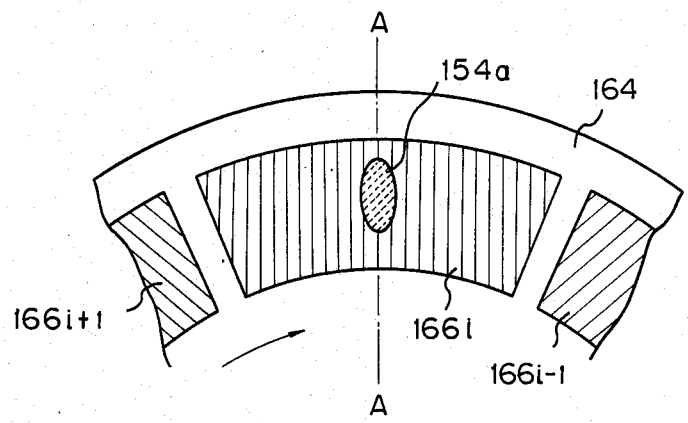
FIG. 6 shows a laser beam incident to a diffraction point of a hologram diffraction grating.

Referring to FIG. 5, an optical scanning device 150 includes a lasing device 152 which emits a laser beam 154. The laser beam 154 is routed through a cylindrical lens 156 and a beam trimming aperture 158 and, then, sequentially reflected by mirrors 160 and 162 toward a hologram grating disc 164 at a predetermined angle of incidence. On the disc 164, the laser beam 154 becomes incident to one of hologram diffraction gratings. As shown in FIG. 6, the hologram grating disc 164 has a circular configuration and is produced by forming a plurality of optically equivalent hologram diffraction gratings $166_1$, $166_2$, $166_3$, ... $166_i$, ... in an annular arrangement on one surface of a transparent circular substrate. The diffraction gratings 166, are each a linear diffraction grating configured as a surface relief hologram or a volumetric phase hologram, for example.

The disc 164 is fixedly mounted on an output shaft of a motor 168 by means of a fixture to be driven for rotation by the motor 168.

In FIG. 6, the grating lines of the hologram diffraction grating 166, are parallel to an imaginary line A—A which interconnects the center of the diffraction grating and the center of rotation of the disc 164. As the laser beam 154 is incident to the hologram diffraction grating $166_i$, the grating $166_i$ generates a diffracted beam. While the disc 164 is rotated by the motor 168, the orientation of the grating lines of the grating $166_i$ relative to the incident laser beam 154 sequentially changes, or rotates, with the result that the direction of the diffracted beam changes along a conical plane whose apex is defined by the incident point of the laser beam 154. Since the diffraction gratings $166_i$ on the disc 164 are optically equivalent to each other, the rotation of the disc 164 causes the diffracted beam to be repeatedly deflected every time the diffraction grating $166_i$ to which the beam 154 is incident changes from one to another.

As shown in FIG. 5, the diffracted beam output from the disc 164 is reflected by a flat mirror 170 which is located above the disc 164 and, then, routed through an fθ lens 172, flat mirrors 174 and 176, and a cylindrical lens 178 to converge in a spot on a photoconductive element 180. As the disc 164 rotates, the beam spot on the photoconductive element 180 is linearly displaced to scan the surface of the element 180 in the main scan direction. The reference numeral 182 designates a photosensor for generating a sync detection signal which is adapted to determine a write start position.

In summary, it will be seen that the present invention provides a lasing device in which the temperature control effect attainable with a thermistor, a Peltie effect element, a finned member and the like efficiently extends to support members associated with a semiconductor laser and a collimating lens assembly to control the support members to a predetermined temperature, thereby eliminating the influence of thermal expansion (contraction) on the spacing between the laser and the collimating lens assembly.

Various modifications will become possible for those skilled in the art after receiving the teachings of the present disclosure without departing from the scope thereof.

What is claimed is:

1. A lasing device in an optical scanning system, said lasing device comprising:
   a semiconductor laser which emits a divergent laser beam;
   an optical system which focuses the divergent laser beam to a parallel beam;
   support means for mechanically supporting said semiconductor laser and said optical system in a fixed imaging position;
   temperature control means for controlling a temperature of said support means to a predetermined temperature;

heat-insulating means for thermally insulating the support means by surrounding the support means; and isolating means connected to the heat-insulating means and surrounding said optical system for thermally isolating an aperture which defines an optical path for the laser beam whereby said optical system is kept at the same temperature as said laser.

2. A lasing device as claimed in claim 1, wherein the isolating means comprises a ½ wavelength plate.

3. A lasing device in an optical scaning system, said lasing device comprising:

a semiconductor laser which emits a divergent laser beam;

an optical system which focuses the divergent laser beam to a parallel beam;

support means for mechanically supporting said semiconductor laser and said optical system in a fixed imaging position; and temperature control means for controlling a temperature of said support means to a predetermined temperature;

wherein the support means comprises a spacer for supporting the semiconductor laser and a flange for supporting the optical system, said flange being held in tight engagement with said spacer; and whereby said optical system is kept at the same temperature as said laser.

4. A lasing device as claimed in claim 3, wherein the optical system comprises a collimating lens assembly and a lens holder for holding said collimating lens assembly.

5. A lasing device as claimed in claim 3, wherein the heat-insulating means comprises a cylindrical heat-insulating member which surrounds the spacer and a cap member which surrounds the flange and the optical system.

6. A lasing device as claimed in claim 3, wherein the temperature control means comprises a thermistor and a Peltie effect element.

* * * * *